US006987065B2

(12) United States Patent
Sorada et al.

(10) Patent No.: US 6,987,065 B2
(45) Date of Patent: Jan. 17, 2006

(54) METHOD OF MANUFACTURING SELF ALIGNED ELECTRODE WITH FIELD INSULATION

(75) Inventors: Haruyuki Sorada, Hirakata (JP); Takeshi Takagi, Kyoto (JP); Akira Asai, Osaka (JP); Akira Inoue, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/891,038

(22) Filed: Jul. 15, 2004

(65) Prior Publication Data

US 2004/0259319 A1    Dec. 23, 2004

Related U.S. Application Data

(63) Continuation of application No. PCT/JP04/00125, filed on Jan. 9, 2004.

(30) Foreign Application Priority Data

Jan. 10, 2003    (JP)    ............................. 2003-004471

(51) Int. Cl.
*H01L 21/311*    (2006.01)

(52) U.S. Cl. ...................... 438/700; 438/933; 438/938; 438/400

(58) Field of Classification Search ................ 438/400, 438/424, 700, 933, 938
See application file for complete search history.

(56) References Cited

U.S. PATENT DOCUMENTS

| 5,650,339 A | 7/1997 | Saito et al. |
| 6,150,241 A | 11/2000 | Deleonibus |

FOREIGN PATENT DOCUMENTS

| JP | 8-213494 | 8/1996 |
| JP | 9-199730 | 7/1997 |
| JP | 10-150204 | 6/1998 |
| JP | 2000-082813 A | 3/2000 |
| JP | 2000-514241 A | 10/2000 |

*Primary Examiner*—Bradley K. Smith
(74) *Attorney, Agent, or Firm*—McDermott Will & Emery LLP

(57) ABSTRACT

The present invention provides a semiconductor device comprising: a semiconductor layer (3); a gate electrode (11) formed on the semiconductor layer (3) via a gate insulation film (10); and a first insulation film (13) formed at one or more of sidewalls of the semiconductor layer (3), the gate insulation film (10) and the gate electrode (11); wherein the first insulation film (13) overlies a part of the gate insulation film (10) surface. According to the semiconductor device, leakage current at the isolation edge can be suppressed and thus reliability can be improved.

22 Claims, 14 Drawing Sheets

METHOD OF MANUFACTURING SELF ALIGNED ELECTRODE WITH FIELD INSULATION

This is a continuation of Application No. PCT/JP04/00125, filed Jan. 9, 2004.

TECHNICAL FIELD

The present invention relates to a semiconductor device and a process for manufacturing the same.

BACKGROUND OF THE INVENTION

In the technical field of semiconductor devices, higher speed, higher integration density and lower power consumption LSIs or memories are in great demand for realizing ubiquitous networks and wearable portable devices. Therefore, the generational changes in design rules are becoming increasingly accelerated (e.g., International Technology Roadmap for Semiconductor: ITRS, 1999).

Semiconductor devices with an SOI (Silicon on Insulator) structure are considered to be advantageous in the further miniaturizing LSIs, etc. LOCOS (Local Oxidation of Silicon) has been known as an isolation process for the SOI-type semiconductor devices, however, recently, STI (Shallow Trench Isolation) is often used. Examples of the isolation process are disclosed in Japanese Unexamined Patent Publication Nos. 1997-199730, 1998-150204, 2000-82813, etc.

FIGS. 14(a) and (b) are cross sectional views showing an example of a prior-art semiconductor device in which STI was used for the isolation. FIG. 14(b) is a cross sectional view taken at line D—D in FIG. 14(a).

The semiconductor device has a semiconductor layer 53 formed on the upper surface of a silicon substrate 51 via a buried oxide film 52. The semiconductor layer 53 is configured by laminating a first Si film 54, an SiGe film 55, and a second Si film 56 in this order. The semiconductor layer 53 is shaped like an island with a trench formed by STI, and has a source-drain region 57, a channel region 58, and a body region 59. A gate electrode 61 is formed on the channel region 58 via a gate insulation film 60. Sidewalls 62 are formed at the sides of the gate electrode 61.

Sidewalls of the semiconductor layer 53 are covered by sidewall oxide films 63, and an isolation film 64 is formed on the whole surface of the silicon substrate 51 including the inside of the formed trench. On the isolation film 64, metal wirings 65a, 65b, 65c, and 65d are formed, and are connected to the source-drain region 57, the source-drain region 57, the gate electrode 61 and the body region 59 via contacts 66a, 66b, 66c, and 66d respectively.

In the well-known isolation process using STI, the thickness of the isolation film 64 buried in the trench is reduced by the subsequent wet etching process for removing the oxide film, and as a result, the gate electrode 61 occasionally covers a corner C of the semiconductor layer 53 as shown in FIG. 14(b). Such a state causes an electric field concentration at an isolation edge, and thus threshold voltage drops and leakage current is prone to occur.

It has been suggested that electric field concentration at the isolation edge caused by STI can be avoided by thermally oxidizing the corner C at an elevated temperature of 900° C. or more. However, the elevated temperature causes a lattice relaxation, resulting in dislocation, for example, in the case of silicon germanium (SiGe), which has attracted attention recently. Thus, such a method cannot effectively suppress the electric field concentration.

DISCLOSURE OF THE INVENTION

The present invention is made to solve the above-described problems and it is an object of the present invention to provide a semiconductor device which can suppress leakage current at an isolation edge to improve reliability, and a process for manufacturing the semiconductor device.

The above-described object of the present invention can be achieved by a process for manufacturing a semiconductor device comprising the following steps in this order: a conductive film formation step for forming a first conductive film via a gate insulation film on a substrate provided with a semiconductor layer on a surface, the first conductive film having a higher thermal-oxidation rate than that of the semiconductor layer; a pattern formation step for forming a pattern on the first conductive film; a trench formation step for forming an isolation trench by etching the semiconductor layer and the first conductive film using the pattern formed on the first conductive film as a mask; a first insulation film formation step for forming a first insulation film at sidewalls, which are exposed by the trench, of the semiconductor layer and the first conductive film by thermally oxidizing the sidewalls of the semiconductor layer and the first conductive film; and a gate electrode formation step for forming a gate electrode by etching the first conductive film.

The above-mentioned object of the present invention can be achieved by a semiconductor device comprising: a semiconductor layer; a gate electrode formed on the semiconductor layer via a gate insulation film; and a first insulation film formed at the sidewalls of the semiconductor layer, the gate insulation film and the gate electrode; wherein the first insulation film partially overlies the gate insulation film surface.

BRIEF DESCRIPTION OF DRAWINGS

FIG. 13($b$) is a cross sectional view showing the semiconductor device obtained according to one embodiment of the present invention by the manufacturing process shown in FIGS. 3 through 11 and is a cross sectional view taken at line C—C shown in FIG. 12.

FIG. 13($c$) is a view corresponding to FIG. 13 ($b$) in the case of using a substrate (specifically Si substrate) other than an SOI substrate.

BEST MODE FOR CARRYING OUT THE INVENTION

Figure 1:
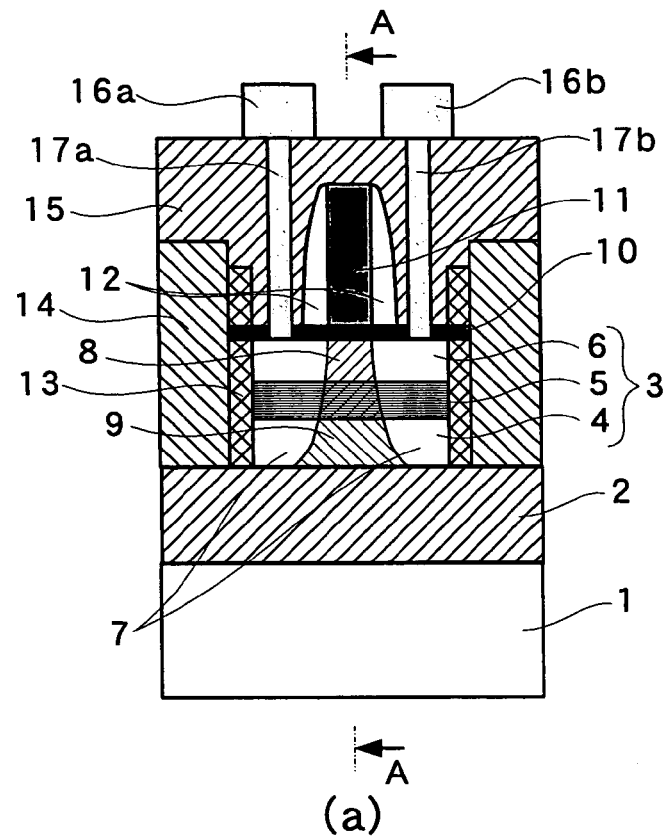
FIGS. 1(a) and (b) are cross sectional views showing a semiconductor device according to one embodiment of the present invention.
Figure 1:
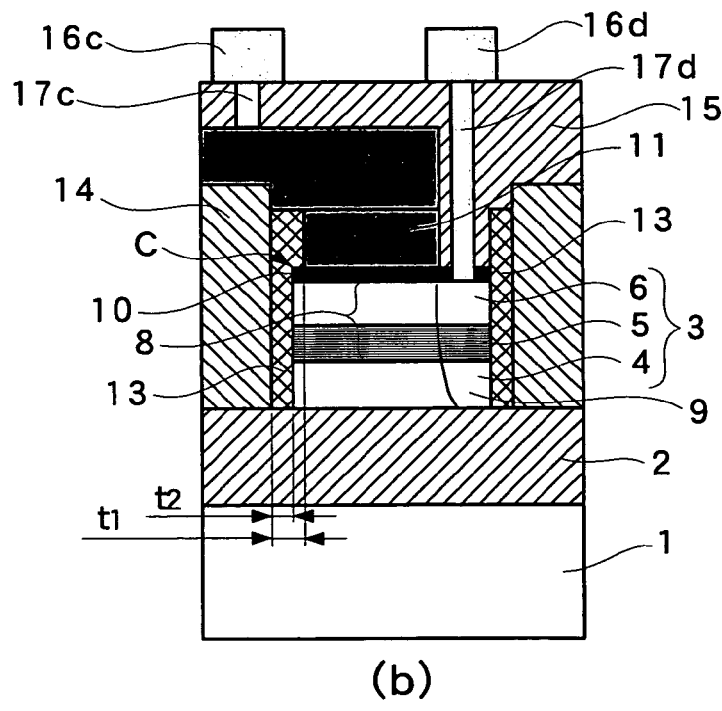

The present invention will be described below in detail according to one embodiment of the present invention with reference to drawings. FIGS. 1($a$) and ($b$) are cross sectional views showing a semiconductor device according to one embodiment of the present invention. FIG. 1($b$) shows a cross sectional view taken at line A—A shown in FIG. 1($a$).

The semiconductor device of the present embodiment has the following configuration. More specifically, a single-crystal semiconductor layer 3 is formed on the upper surface of a silicon substrate 1 via a buried insulation film typified by a buried oxide film 2. The semiconductor layer 3 is configured by laminating a first Si film 4, an SiGe film 5 and a second Si film 6 in this order. The buried oxide film 2 also serves as an etching stop film as is described later with reference to FIG. 6. Such a silicon substrate 1 on the surface of which a single-crystal semiconductor layer 3 is formed via a buried insulation film typified by a buried oxide film 2 is commercially available as a so-called SOI (Silicon on Insulator) substrate.

As described later, in the present invention, an SOI substrate is not necessarily used and a substrate 1 on the surface of which the single-crystal semiconductor layer 3 is formed may be used. Such a substrate 1 includes typical bulk-Si substrates.

The semiconductor layer 3 is shaped like an island with a trench formed by STI, and has a source-drain region 7, a channel region 8 and a body region 9. On the channel region 8, a gate electrode 11 is formed via a gate insulation film 10.

Sidewalls 12 are formed at the sides of the gate electrode 11 as shown in FIG. 1($a$). As shown in FIG. 1 ($b$), the gate electrode 11 has a step-like form in which one end surface of the bottom part in the longitudinal direction is covered by a first insulation film 13, and one end portion in the longitudinal direction of the upper part overlies the top surface of the first insulation film 13.

The first insulation films 13 are formed at the sidewalls of the semiconductor layer 3, and a second insulation film 14 is buried inside the trench. An interlayer insulation film 15 is formed over the entire surface of the silicon substrate 1. On the interlayer insulation film 15, metal wirings 16$a$, 16$b$, 16$c$, and 16$d$ are formed and are connected to the source-drain region 7, the source-drain region 7, the gate electrode 11 and the body region 9 via contacts 17$a$, 17$b$, 17$c$, and 17$d$ respectively.

Figure 2:
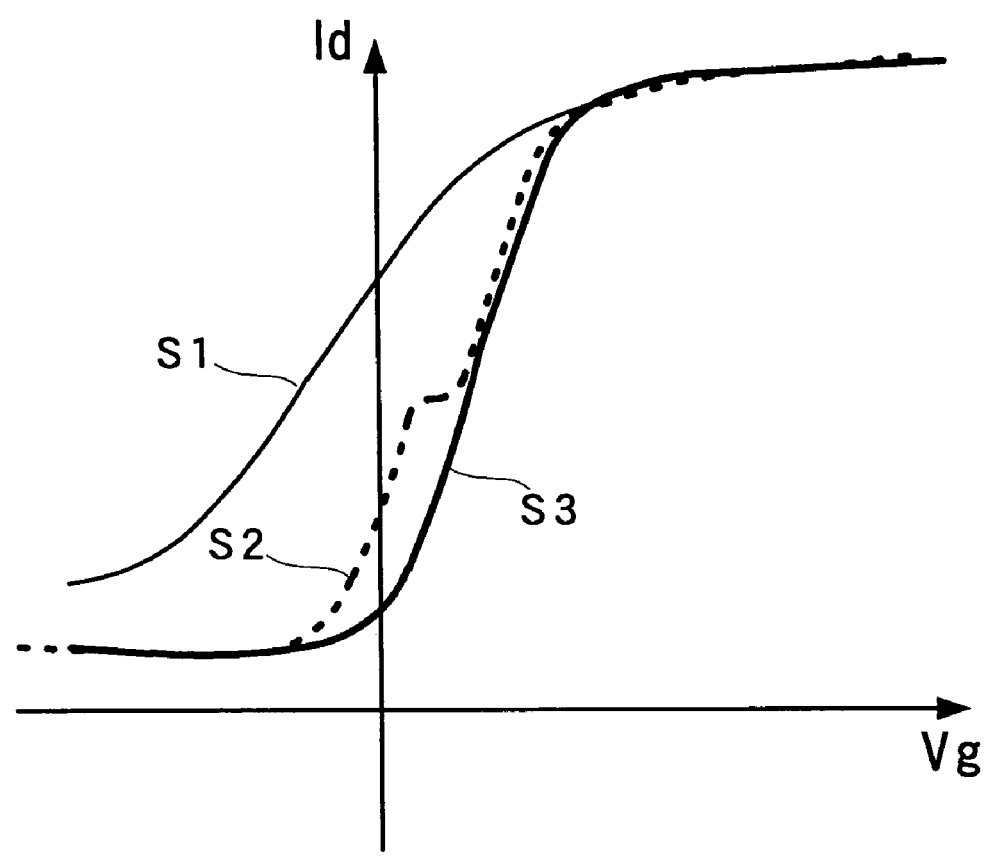
FIG. 2 is a view showing the relationship between drain current and gate voltage.

As shown in FIG. 1($b$), the first insulation film 13 of the semiconductor device according to the present embodiment is formed so that the film thickness t1 of the region located above the gate insulation film 10 is larger than the film thickness t2 of the region adjacent to the semiconductor layer 3. Thus, a corner part C of the semiconductor layer 3 is covered by the first insulation film 13. Therefore, there is no possibility that an electric field concentration may occur when the gate electrode located above the semiconductor layer covers the corner part of the semiconductor layer, which occurred in the prior-art semiconductor device. Moreover, the semiconductor device of the present embodiment can avoid leakage current increases (refer to the reference character S1 in FIG. 2) due to channel formation at the isolation edge and kink-effect occurrence (refer to the reference character S2 in FIG. 2) caused by reduced threshold voltage. Thus, good electrical properties can be obtained as illustrated by the reference character S3 in FIG. 2, and reliability can be improved. In this specification, FIG. 2 shows the relationship between drain current and gate voltage (Id-Vg characteristic).

In the first insulation film 13, the film thickness t2 of the region adjacent to the semiconductor layer 3 is preferably from 2 to 10 nm, and is more preferably from 3 to 6 nm. In order to securely isolate the corner part C of the semiconductor layer 3 from the gate electrode 11, the difference in the film thickness between t1 of the region located above the semiconductor layer 3 and t2 of the region adjacent to the semiconductor layer 3 is preferably from 1 to 100 nm, and is more preferably from 5 to 50 nm. The first insulation film 13 is preferably a thermal-oxidation film, whereby a good insulation effect and reduced leakage current can be attained as compared with TEOS (Tetraethylorthosilicate) etc.

The semiconductor layer 3 of the present embodiment has a laminar structure composed of the first Si film 4, the SiGe film 5 and the second Si film 6, which are of a single crystal.

In particular, it is effective that channel formation can be inhibited by reducing the influence of gate voltage on the sidewalls of the SiGe film 5. The semiconductor layer 3 may have a configuration such that an Si film is formed on an SiGe film rather than the configuration of the present embodiment in which the SiGe film is formed on the Si film. Moreover, for example, an SiGeC film, an SiC film, etc., may be employed rather than the SiGe film. Furthermore, the commonly-used SOI layer in which single-crystal silicon alone is formed on an insulation film can be employed.

Figure 3:
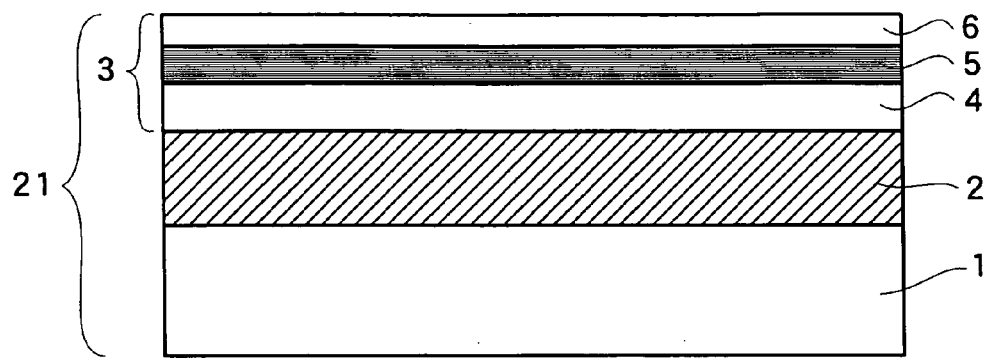
FIG. 3 is a view illustrating a process for manufacturing the semiconductor device according to one embodiment of the present invention, which shows a semiconductor layer formation step for forming a semiconductor layer 3 on a silicon substrate 1 having an etching stop film.

The process for manufacturing the above-mentioned semiconductor device is described below. As shown in FIG. 3, the buried oxide film 2, the first Si film 4, the SiGe film 5, and the second Si film 6 are laminated on the silicon substrate 1 in this order, to form a semiconductor substrate 21 provided with the semiconductor layer 3 which is composed of the first Si film 4, the SiGe film 5 and the second Si film 6. More specifically, the semiconductor substrate 21 can be obtained by forming an SiGe film and an Si cap layer through epitaxial growth by UHV-CVD (Ultra High Vaccum-Chemical Vapor Deposition) on an SOI (Silicon on Insulator) substrate provided with single-crystal Si formed on an insulator. The thicknesses of the buried oxide film 2, the first Si film 4, the SiGe film 5 and the second Si film 6 are, for example, about 400 nm, about 150 nm, about 15 nm and about 15 nm respectively. The Ge concentration of the SiGe film 5 is, for example, about 30%. The SiGe film 5 is strained due to a lattice mismatch with the first Si film 4.

Figure 4:
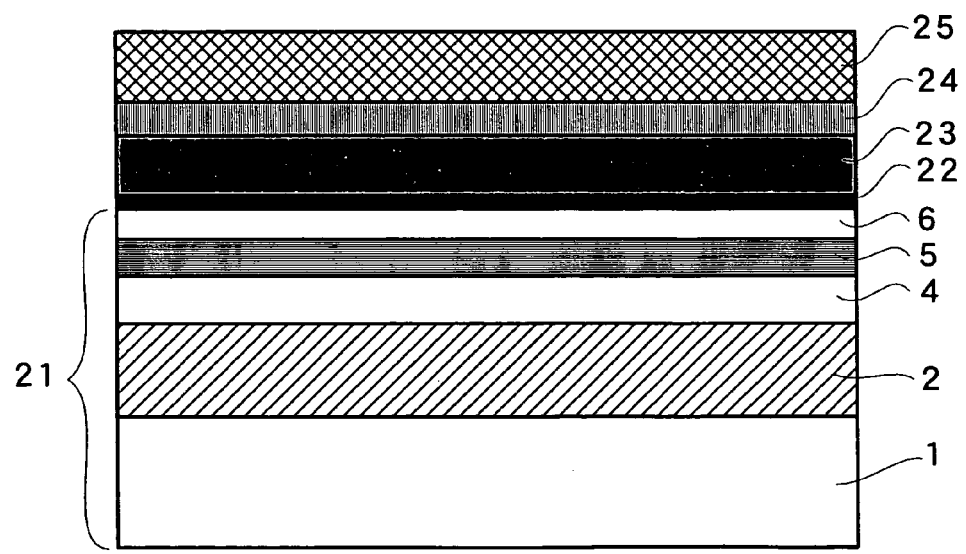
FIG. 4 is a view illustrating a process subsequent to FIG. 3 for manufacturing the semiconductor device according to one embodiment of the present invention, which shows a conductive film formation step for forming a first conductive film 23 which has higher thermal-oxidation rate than that of the semiconductor layer 3.

Subsequently, as shown in FIG. 4, the gate insulation film 10 composed of a silicon oxide film 22 is formed by oxidizing the entire surface of the semiconductor substrate 21. It is preferable to form the silicon oxide film 22 at a temperature which does not permit relaxation of the lattice strain of the SiGe film 5. Moreover, it is preferable that the second Si film 6 alone is oxidized and that the SiGe film 5 is not oxidized during the formation process of the silicon oxide film 22. For example, the gate insulation film 10 composed of the silicon oxide film 22 about 6 nm thick can be formed through oxidation for about 10 minutes at 700 to 800° C. under wet atmosphere. The film thickness of the second Si film 6 is reduced to be about 5 nm by the washing and oxidation involved in the steps of forming the gate insulation film 10 composed of the silicon oxide film 22.

Next, a conductive film typified by a first polysilicon film 23 which has conductivity and is about 100 nm thick is deposited on the silicon oxide film 22 using LPCVD method (Low Pressure Chemical Vapor Deposition), etc. The first conductive film 23 may be formed by a film other than a polysilicon film as long as the thermal oxidation rate thereof is higher than that of the semiconductor layer 3. In particular, when a polysilicon-germanium film or a polysilicon-germanium-carbon film containing Ge is used as a conductive film, Ge is more prone to oxidation than Si, whereby a higher rate of oxidation than that of the semiconductor layer 3 can be obtained, and such film is thus preferable.

When the silicon substrate 1 is used as a substrate, however, it is preferable to use a polycrystalline semiconductor film typified by the polysilicon film 23 as the first conductive film 23, and a single-crystal semiconductor film which contains silicon as the semiconductor layer 3.

The surface of the first polysilicon film 23 is subjected to thermal oxidation, to form a protective oxide film 24 about 10 nm thick. Subsequently, a silicon nitride film 25 about 200 nm thick is formed by LPCVD method, etc. The protective oxide film 24 and silicon nitride film 25 thus formed are referred to together as a "pattern" in this specification.

Figure 5:
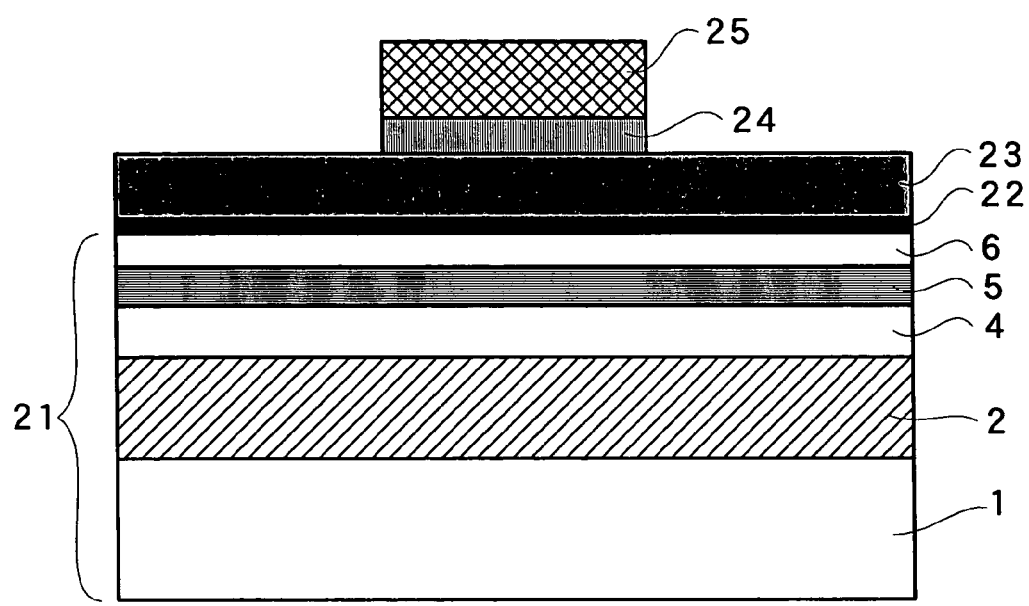
FIG. 5 is a view illustrating a process subsequent to FIG. 4 for manufacturing the semiconductor device according to one embodiment of the present invention, which shows a pattern formation step for forming patterns 24 and 25 on the first conductive film 23.
Figure 6:
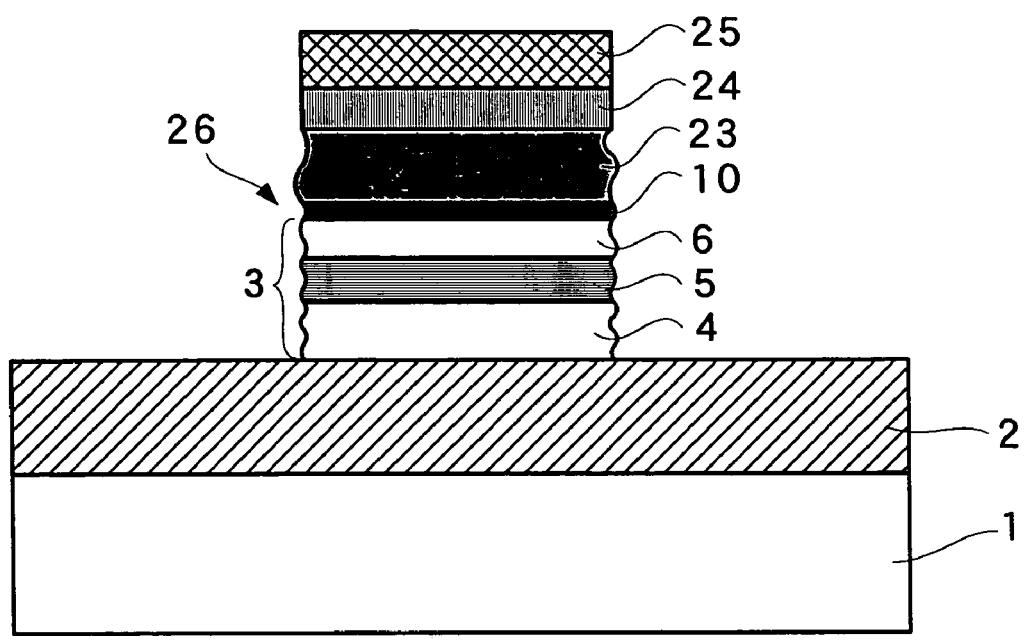
FIG. 6 is a view illustrating a process subsequent to FIG. 5 for manufacturing the semiconductor device according to one embodiment of the present invention, which shows a trench formation step for forming an isolation trench 28 by etching the semiconductor layer 3 and the first conductive film 23 by using as a mask the patterns 24 and 25 formed on the first conductive film 23.

A resist film or an insulation film (not shown) is formed on the silicon nitride film 25, followed by patterning of the silicon nitride film 25 and protective oxide film 24 as shown in FIG. 5. The silicon nitride film 25 subjected to patterning is used as an etching mask for dry etching, and the first polysilicon film 23, the gate insulation film 10, the second Si film 6, the SiGe film 5 and the first Si film 4 are successively patterned. Thus, as shown in FIG. 6, an isolation trench 28 provided with sidewalls 26 is formed with the surface of the buried oxide film 2 as its bottom surface.

In this dry etching process, the buried oxide film 2 serves as an etching stop film. More specifically, the first polysilicon film 23, the gate insulation film 10, the second Si film 6, the SiGe film 5 and the first Si film 4 are successively subjected to dry etching until the buried oxide film 2 is exposed as shown in FIGS. 5 and 6.

Figure 15:
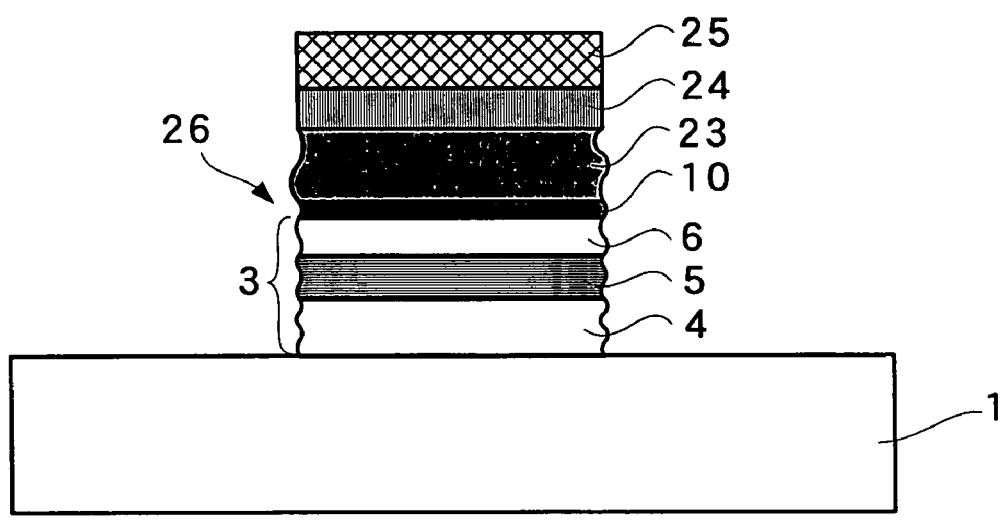
FIG. 15 is a view illustrating a process subsequent to FIG. 5 of the semiconductor device according to one embodiment of the present invention in the case of using a substrate (specifically Si substrate) other than an SOI substrate, and which shows a trench formation step as in FIG. 6.

In FIG. 5, the buried oxide film 2 is used as an etching stop film. When a substrate other than the SOI substrate such as the Si substrate 1 (specifically a substrate composed of single-crystal silicon) is used, the isolation trench 28 having sidewalls 26 can be formed also by the following process as shown in FIG. 15. More specifically, the etching period for the first polysilicon film 23, the gate insulation film 10, the second Si film 6, the SiGe film 5 and the first Si film 4 is determined appropriately, and then etching is stopped when the Si substrate 1 is exposed by etching the first Si film 4 formed on the Si substrate 1. The person skilled in the art can appropriately determine the etching peiod.

Figure 7:
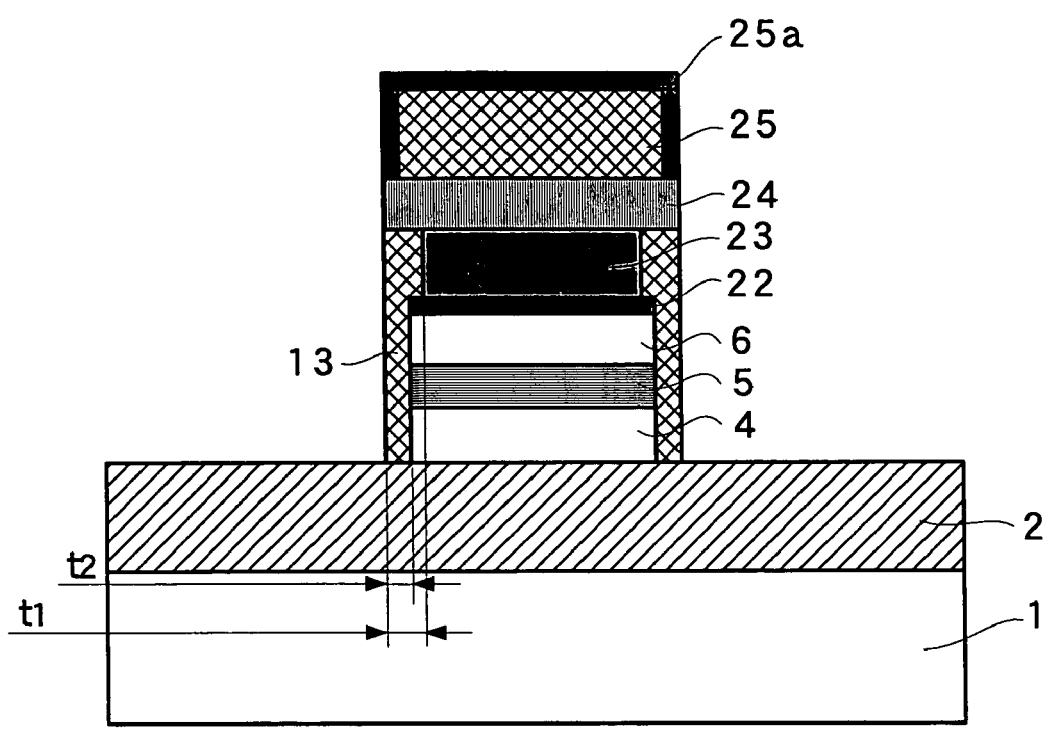
FIG. 7 is a view illustrating a process subsequent to FIG. 6 for manufacturing the semiconductor device according to one embodiment of the present invention, which shows a first insulation film formation step for forming first insulation films 13 at the sidewalls of the semiconductor layer 3 and the first conductive film 23 by thermally oxidizing the sidewalls of the semiconductor layer 3 and the first conductive film 23 which are exposed by a trench 28.

After washing of the sidewalls 26, the first insulation film 13 is formed as shown in FIG. 7 by subjecting the sidewalls 26 which were damaged by dry etching to dry oxidation or wet oxidation at about 750° C. so that the damage can be reduced. It is preferable that the sidewalls 26 are washed with a chemical solution including ammonia and oxygenated water. Thus, germanium atoms of the SiGe film 5 can be selectively etched, whereby the germanium concentration of the SiGe film 5 can be reduced. As a result, in the process of oxidizing the sidewalls 26, Ge aggregation and Ge—O binding in the oxide film of the SiGe film can be suppressed, whereby leakage current can be inhibited and reliability can be improved.

In the process of thermal oxidation of the sidewalls 26, the growth rate of the first insulation film 13, which is a thermal-oxidation film, is different between the semiconductor layer 3 which is composed of a single-crystal Si and SiGe film and the first polysilicon film 23 located above. More specifically, the thermal-oxidation rate of the single-crystal semiconductor layer typified by the single-crystal Si and SiGe film is low, while the thermal-oxidation rate of the polycrystalline semiconductor layer typified by the polysilicon film 23 etc. is high. As a result, in the first insulation film 13, the film thickness t1 of the region located above the semiconductor layer 3 is greater than the film thickness t2 of the region adjacent to the semiconductor layer 3, whereby the corner part C of the semiconductor layer 3 is covered by the first insulation film 13. The film thickness t2 is preferably enlarged with a view to obtaining a large difference between the film thicknesses t1 and t2. However, an excessively enlarged film thickness t2 might increase leakage current since the SiGe film 5 which has a lattice strain might be excessively oxidized. Therefore, the film thickness t2 is preferably within the range from 2 to 10 nm, and is in particular preferably within the range from 3 to 6 nm. The film thickness can be controlled by appropriately determining oxidation conditions (temperature, period, etc.). The difference between the film thicknesses t1 and t2 can be also adjusted to the desirable range described in the explanation of the semiconductor device by setting the film thickness t2 in the above-mentioned numerical range. A thin thermal-oxidation film 25a is formed at the sides and on the upper surface of the silicon nitride film 25.

The sidewalls 26 are subjected to thermal-oxidation preferably at 650 to 800° C. and more preferably at 700 to 800° C. so that relaxation of the strained SiGe film 5 can be suppressed.

Figure 8:
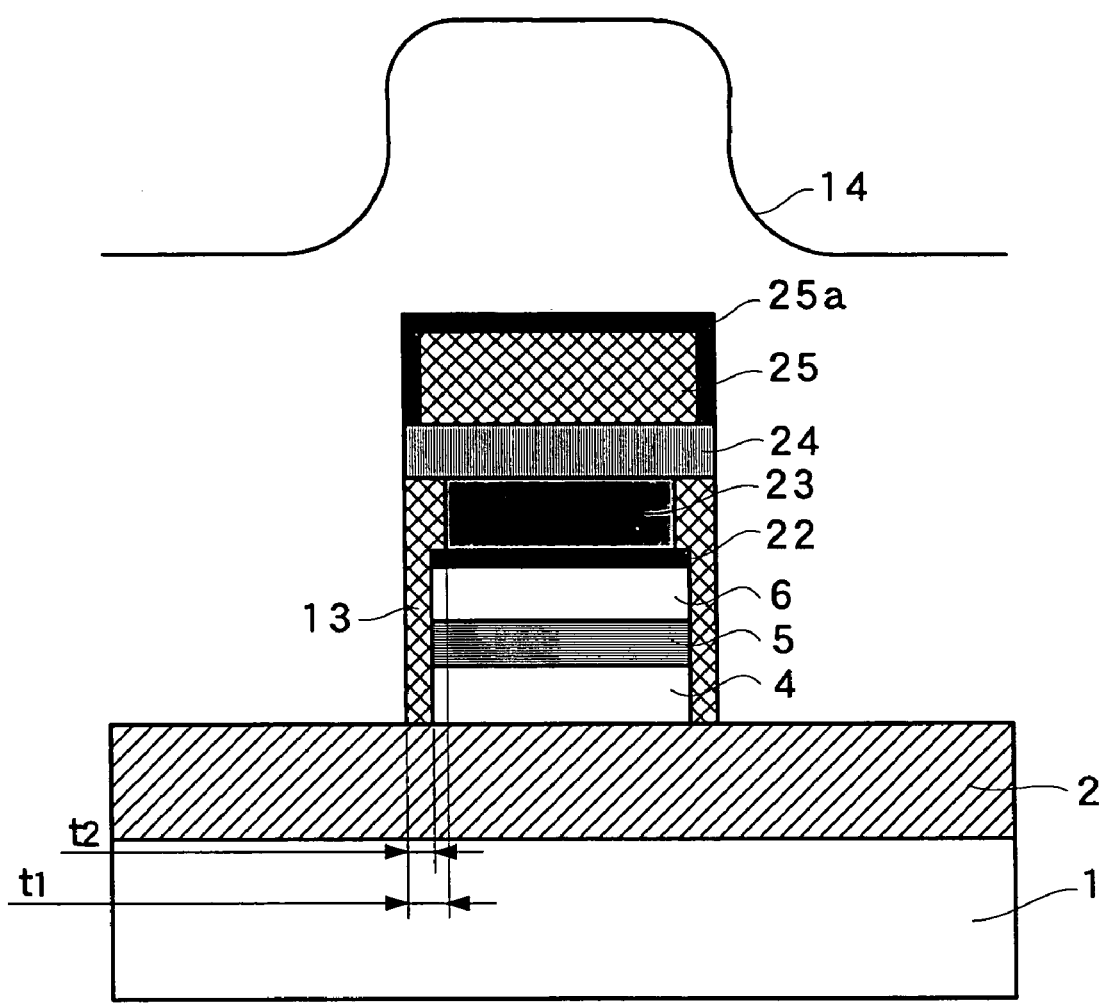
FIG. 8 is a view illustrating a process subsequent to FIG. 7 for manufacturing the semiconductor device according to one embodiment of the present invention, which shows a trench burying process for burying the trench 28 with a second insulation film 14.
Figure 9:
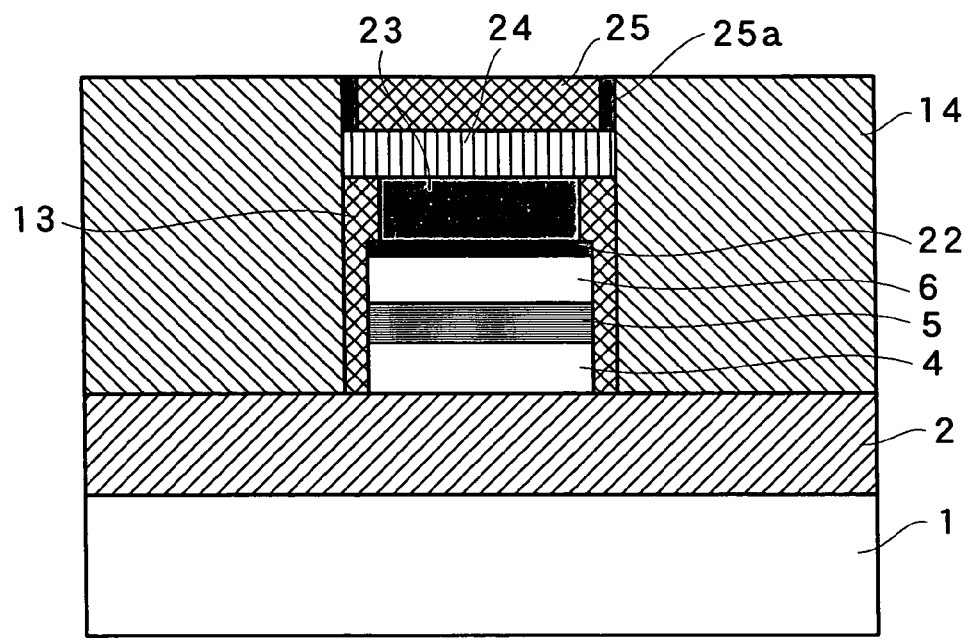
FIG. 9 is a view illustrating a process subsequent to FIG. 8 for manufacturing the semiconductor device according to one embodiment of the present invention, which shows a flattening process for flattening the surface of the second insulation film 14 so that the patterns 24 and 25 are exposed.

As shown in FIG. 8, the second insulation film 14 composed of a silicon oxide film is deposited, for example, by LPCVD method using TEOS (Tetraethylorthosilicate) as a starting material at a low temperature (about 600° C.), to bury the trench. The surface is then flattened by CMP (Chemical-Mechanical Polishing) etc., while leaving some of the silicon nitride film 25 as shown in FIG. 9.

Figure 10:
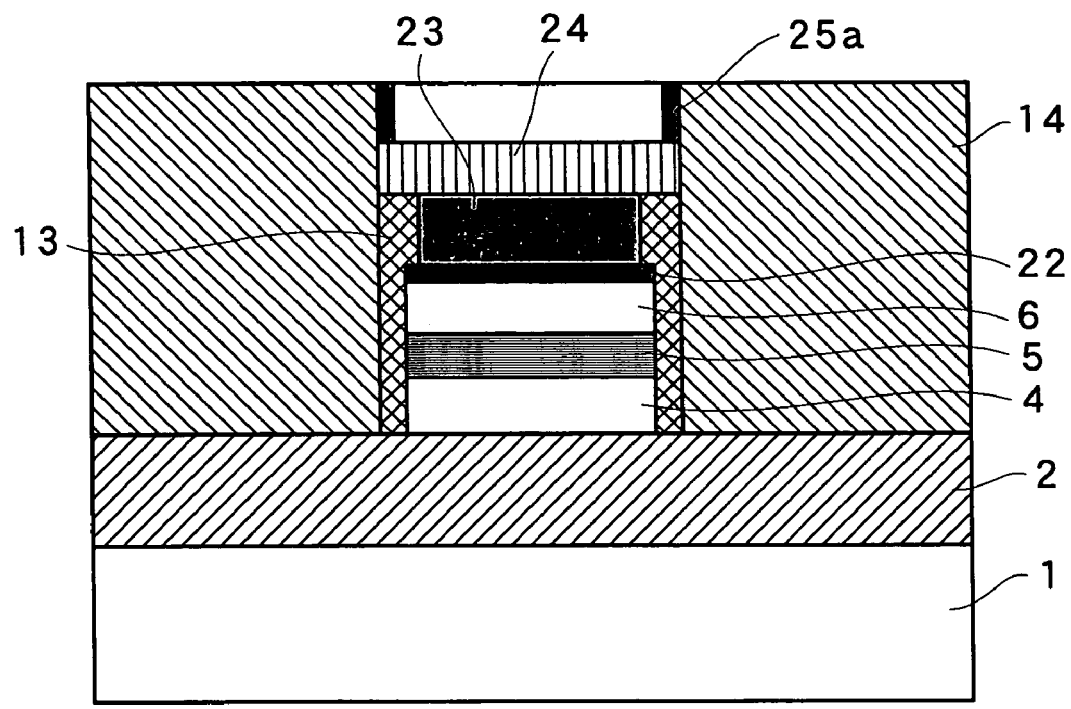
FIG. 10 is a view illustrating a process subsequent to FIG. 9 for manufacturing the semiconductor device according to one embodiment of the present invention, which shows a conductive film exposing step for exposing the first conductive film 23 by removing the patterns 24 and 25.
Figure 11:
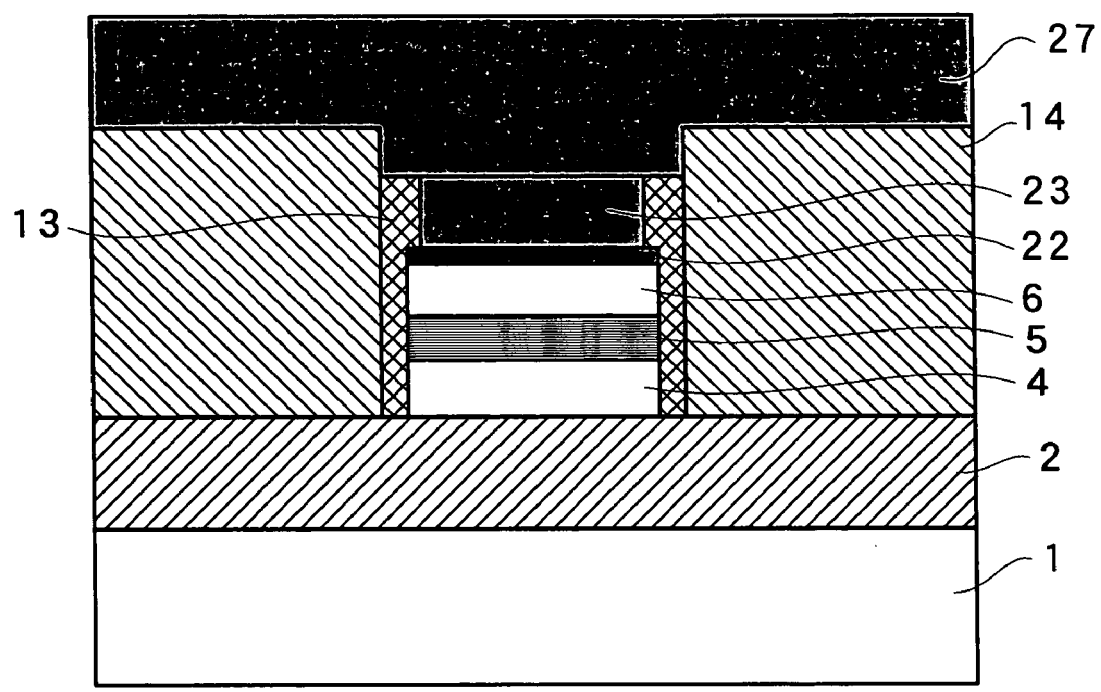
FIG. 11 is a view illustrating a process subsequent to FIG. 10 for manufacturing the semiconductor device according to one embodiment of the present invention, which shows a second conductive film formation step for forming a second conductive film 27 on the first conductive film 23 and the second insulation film 14.
Figure 12:
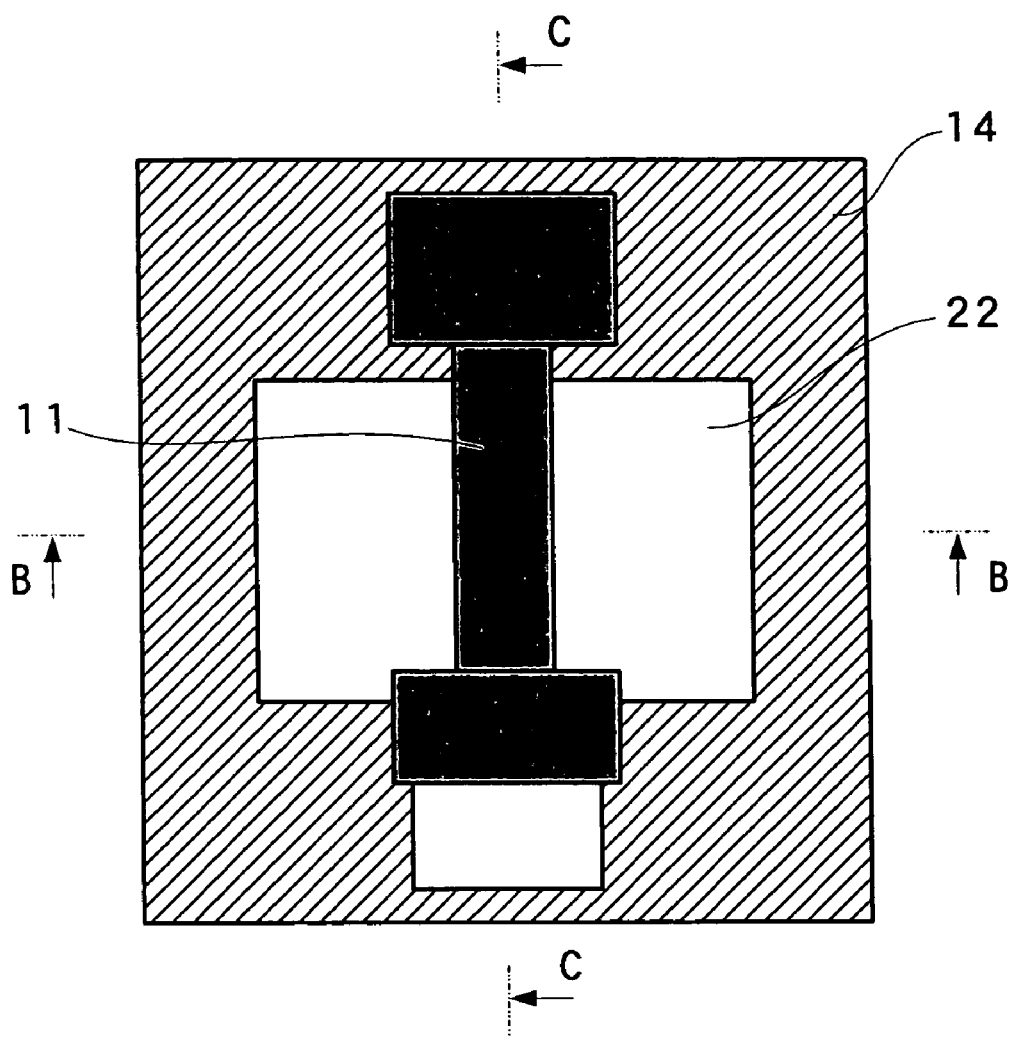
FIG. 12 is a plan view showing a semiconductor device obtained according to one embodiment of the present invention by the manufacturing process shown in FIGS. 3 through 11.
Figure 13:
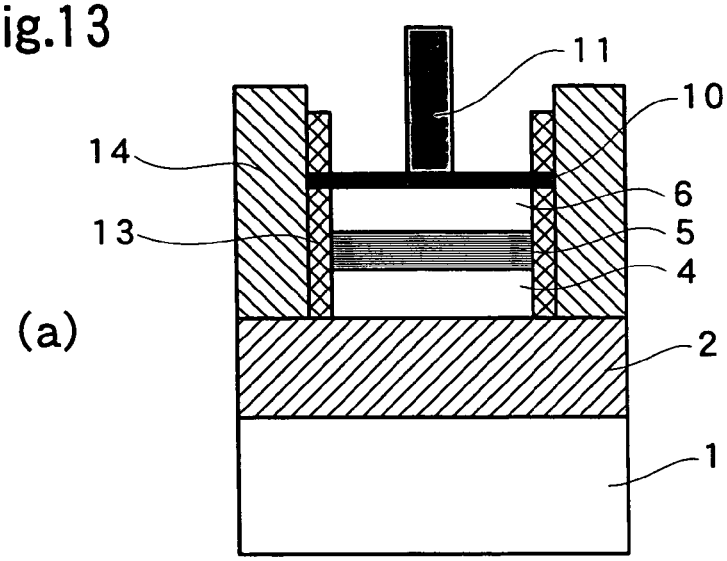
FIG. 13($a$) is a cross sectional view showing the semiconductor device obtained according to one embodiment of the present invention by the manufacturing process shown in FIGS. 3 through 11 and is a cross sectional view taken at line B—B shown in FIG. 12.
Figure 13:
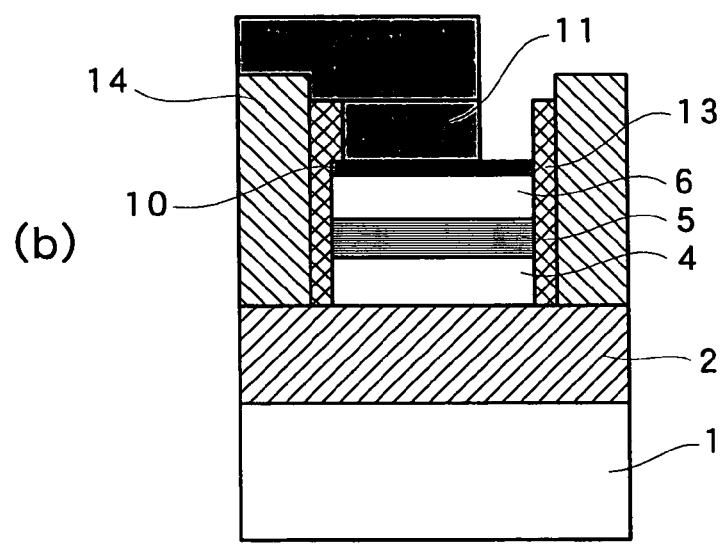
Figure 13:
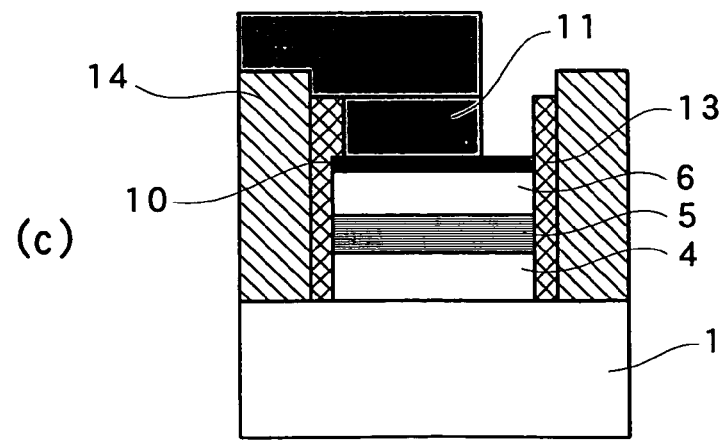
Figure 14:
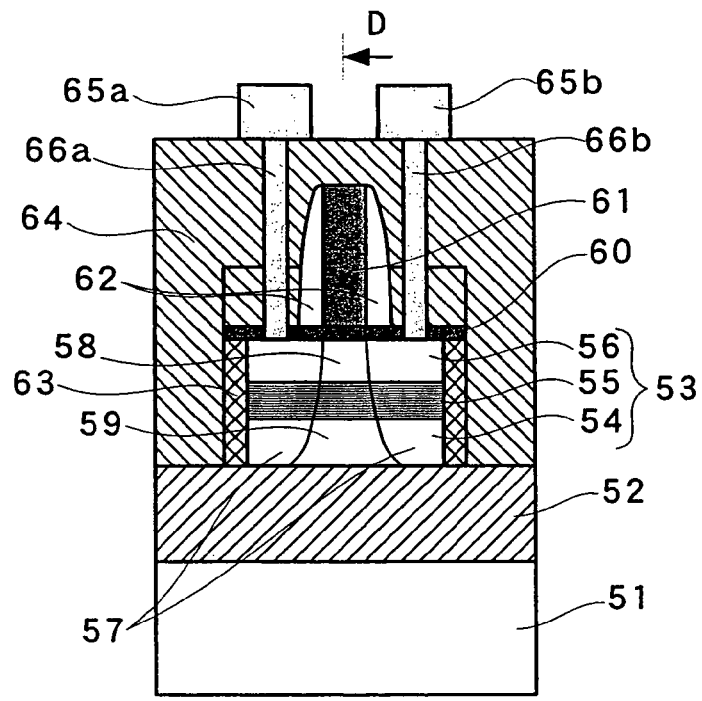
FIGS. 14($a$) and ($b$) are cross sectional views showing a prior-art semiconductor device.
Figure 14:
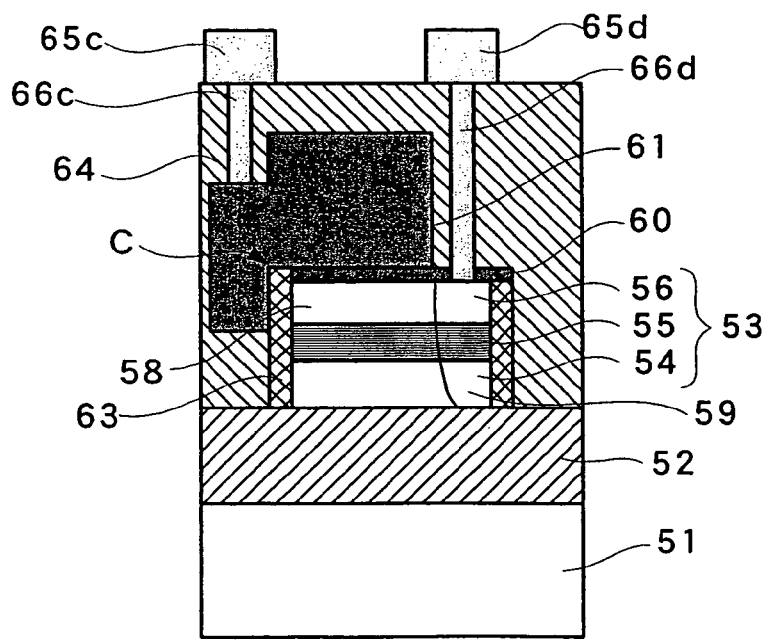

As shown in FIG. 10, the exposed silicon nitride film 25 is completely removed by wet etching using hot phosphoric acid at about 150° C. Subsequently, the exposed protective oxide film 24 is removed by wet etching using dilute hydrofluoric acid, to expose the polysilicon film 23. Before a natural oxide film is formed, a second polysilicon layer 27 is further deposited as a second conductive film on the second insulation film 14 as shown in FIG. 11. Instead of the second polysilicon layer 27, a metal such as tungsten may be formed on the second insulation film 14 or a metal such as tungsten may be laminated on the second polysilicon layer 27. The laminated first polysilicon film 23 and second polysilicon film 27 are then subjected to dry etching, to form a gate electrode 11 of a predetermined form as shown in FIGS. 12 (plan view) and 13 (cross sectional views). In this specification, FIGS. 13(a) and (b) are cross sectional views taken at line B—B and line C—C in FIG. 12 respectively. FIG. 13(c) is a drawing corresponding to FIG. 13(b) when a substrate (specifically, the Si substrate) other than the SOI substrate is used.

Following this, according to the usual CMOS process, the sidewalls 12, the source-drain region 7 and the interlayer insulation film 15 are formed and the metal wirings 16a, 16b, 16c, and 16d are then formed so as to independently control a gate, a source-drain, and a body, to thereby complete a MOSFET as shown in FIGS. 1(a) and (b). In the heat-treatment process for activating the source-drain, a rapid heat treatment (RTA) of 30 seconds or less is employed, and is preferably conducted at a temperature which does not permit relaxation of the strain of the SiGe film 5. For example, in a configuration with the SiGe film 5 (thickness: about 15 nm) with the Ge concentration of about 30%, RTA is carried out at a temperature in the range from 900 to 1000° C. According to the process for manufacturing the semiconductor device of the present embodiment, the first insulation film formed by thermally oxidizing the trench sidewalls is configured to have a difference in the film thickness by utilizing the difference in the oxide film growth rate between the semiconductor layer and the first polysilicon film. Therefore, the corner part of the semiconductor layer is easily and surely covered by the first insulation film.

Moreover, the temperature can be prevented from rising excessively during the whole process, and therefore even if the semiconductor layer has a lattice strain as with the SiGe film, the strain can be inhibited from relaxing, to thereby maintain good carrier mobility properties. Moreover, leakage current at the isolation edge can be more effectively prevented by adjusting to the above-mentioned desired range the thermal-oxidation temperature and the film thickness when forming the first insulation film at the trench sidewalls.

The present embodiment refers to the semiconductor layer in which the SiGe film is formed on the Si layer. However, the manufacturing process of the present embodiment can be applied to other configurations as mentioned above as modifications of the semiconductor layer, and the same effects can be obtained. More specifically, the semiconductor layer 3 may be composed of a single-crystal silicon film of a uniform composition, or may be composed of two or more semiconductor films whose composition are different from each other may be used (for example, a single-crystal silicon film and a single-crystal silicon-germanium film).

INDUSTRIAL APPLICABILITY

As described above, the present invention can provide a semiconductor device which suppresses leakage current at the isolation edge to thereby improve the reliability and a process for manufacturing the same.

The invention claimed is:

1. A process for manufacturing a semiconductor device comprising the following steps in this order:
   a conductive film formation step for forming a first conductive film via a gate insulating film on a semiconductor layer provided on a surface of the substrate, the first conductive film having a higher thermal-oxidation rate than that of the semiconductor layer;
   a pattern formation step for forming a pattern on the first conductive film;
   a trench formation step for forming an isolation trench by etching the semiconductor layer and the first conductive film using the pattern formed on the first conductive film as a mask;
   a first insulation film formation step for forming a first insulation film only at sidewalls, which are exposed by the trench, of the semiconductor layer and the first conductive film by thermally oxidizing the sidewalls of the semiconductor layer and the first conductive film; and
   a gate electrode formation step for forming a gate electrode by etching the first conductive film.

2. The process for manufacturing a semiconductor device according to claim 1, wherein the thickness of the first insulation film formed at one or more of the sidewalls of the first conductive film is greater than that of the first insulation film formed at one or more of the sidewalls of the semiconductor layer in the first insulation film formation step.

3. The process for manufacturing a semiconductor device according to claim 2, wherein the difference in the film thicknesses between the first insulation film formed at one or more of the sidewalls of the first conductive film and the first insulation film formed at one or more of the sidewalls of the semiconductor layer is not less than 1 nm and not more than 100 nm.

4. The process for manufacturing a semiconductor device according to claim 2, wherein the thickness of the first insulation film formed at one or more of the sidewalls of the semiconductor layer is not less than 2 nm and not more than 10 nm.

5. The process for manufacturing a semiconductor device according to claim 1 further comprising the following steps in this order between the first insulation film formation step and the gate electrode formation step:
   a trench burying step for burying the trench with a second insulation film;
   a flattening step for flattening a surface of the second insulation film to expose the pattern;

a conductive film exposure step for exposing the first conductive film by removing the pattern through etching; and a second conductive film formation step for forming a second conductive film on the first conductive film and the second insulation film, wherein the gate electrode is formed by etching the second conductive film together with the first conductive film in the gate electrode formation step.

6. The process for manufacturing a semiconductor device according to claim 1, wherein the first conductive film is composed of a polycrystalline semiconductor and the semiconductor layer is composed of a single crystal semiconductor.

7. The process for manufacturing a semiconductor device according to claim 6, wherein the first conductive film is composed of a polysilicon film.

8. The process for manufacturing a semiconductor device according to claim 6, wherein the first conductive film is composed of a polysilicon-germanium film or a polysilicon-germanium-carbon film.

9. The process for manufacturing a semiconductor device according to claim 6, wherein the semiconductor layer contains silicon.

10. The process for manufacturing a semiconductor device according to claim 9, wherein the semiconductor layer is composed of at least two semiconductor films of different composition.

11. The process for manufacturing a semiconductor device according to claim 10, wherein the semiconductor films further contain germanium.

12. The process for manufacturing a semiconductor device according to claim 11, wherein the semiconductor films further contain carbon.

13. The process for manufacturing a semiconductor device according to claim 9, wherein the semiconductor layer further contains carbon.

14. The process for manufacturing a semiconductor device according to claim 9, wherein the semiconductor layer comprises a single-crystal silicon film and an SiGe or SiGeC film having lattice strain.

15. The process for manufacturing a semiconductor device according to claim 9, wherein the semiconductor layer comprises a single-crystal SiGe or SiGeC film and a silicon film having lattice strain.

16. The process for manufacturing a semiconductor device according to claim 1, wherein an etching stop film composed of a buried insulation film is sandwiched between the substrate and the semiconductor layer.

17. The process for manufacturing a semiconductor device according to claim 16, wherein the buried insulation film is composed of a buried oxide film.

18. The process for manufacturing a semiconductor device according to claim 1, wherein the substrate is composed of an Si substrate and the semiconductor layer is composed of a surface of the Si substrate.

19. The process for manufacturing a semiconductor device according to claim 18, wherein etching is stopped when the substrate surface is exposed during the trench formation step.

20. The process for manufacturing a semiconductor device according to claim 1, wherein the sidewalls of the semiconductor layer and the first conductive film are thermally oxidized at a thermal oxidation temperature of not less than 700° C. and not more than 800° C. in the first insulation film formation step.

21. The process for manufacturing a semiconductor device according to claim 1 which further comprises a washing step for washing the sidewalls of the semiconductor layer and the first conductive film using a chemical solution containing ammonia and oxygenated water between the trench formation step and the first insulation film formation step.

22. The process for manufacturing a semiconductor device according to claim 1, wherein the pattern is not removed.

* * * * *